(12) United States Patent
Bouvier et al.

(10) Patent No.: US 11,024,701 B2
(45) Date of Patent: Jun. 1, 2021

(54) INTEGRATED ELECTRONIC COMPONENT SUITABLE FOR BROADBAND BIASING

(71) Applicant: Murata Integrated Passive Solutions, Caen (FR)

(72) Inventors: Stéphane Bouvier, Cairon (FR); Jean-René Tenailleau, Hottot-les-Bagues (FR)

(73) Assignee: MURATA INTEGRATED PASSIVE SOLUTIONS, Caen (FR)

( * ) Notice: Subject to any disclaimer, the term of this patent is extended or adjusted under 35 U.S.C. 154(b) by 15 days.

(21) Appl. No.: 16/420,874

(22) Filed: May 23, 2019

(65) Prior Publication Data
US 2019/0280079 A1 Sep. 12, 2019

Related U.S. Application Data

(63) Continuation of application No. PCT/EP2017/079668, filed on Nov. 17, 2017.

(30) Foreign Application Priority Data

Nov. 24, 2016 (EP) ..................... 16306553

(51) Int. Cl.
| | | |
|---|---|---|
| H01L 23/64 | (2006.01) | |
| H01L 49/02 | (2006.01) | |

(Continued)

(52) U.S. Cl.
CPC ......... *H01L 28/10* (2013.01); *H01F 17/0006* (2013.01); *H01L 21/32139* (2013.01);

(Continued)

(58) Field of Classification Search
CPC ... H01L 23/642; H01L 23/645; H01L 27/016; H01L 28/10; H01L 28/40; H01L 28/82;

(Continued)

(56) References Cited

U.S. PATENT DOCUMENTS

| | | |
|---|---|---|
| 6,169,470 B1 | 1/2001 | Ibata et al. |
| 2003/0127704 A1* | 7/2003 | Kobayashi ............ H01L 23/552 257/531 |

(Continued)

FOREIGN PATENT DOCUMENTS

| | | |
|---|---|---|
| FR | 3012664 A1 | 5/2015 |
| JP | 2005079286 A | 3/2005 |

(Continued)

OTHER PUBLICATIONS

International Search Report Issued for PCT/EP2017/079668, dated Feb. 1, 2018.

(Continued)

*Primary Examiner* — Stephen W Smoot
(74) *Attorney, Agent, or Firm* — Arent Fox LLP

(57) ABSTRACT

An integrated electronic component for broadband biasing that includes a monolithic substrate, a capacitor structure arranged in a trench network that extends into the substrate, and a continuous track of an electrically conducting material arranged in a crater that is formed in the substrate. The continuous track has one or several turns that have decreasing turn sections, and that are supported by a slanted peripheral wall of the crater for forming an inductor.

20 Claims, 6 Drawing Sheets

(51) Int. Cl.
    *H01F 17/00*     (2006.01)
    *H01L 21/3213*     (2006.01)
    *H01L 23/522*     (2006.01)
    *H01L 27/01*     (2006.01)
    *H01F 5/00*     (2006.01)

(52) U.S. Cl.
    CPC ...... *H01L 23/5222* (2013.01); *H01L 23/5227* (2013.01); *H01L 23/642* (2013.01); *H01L 23/645* (2013.01); *H01L 27/01* (2013.01); *H01L 28/87* (2013.01); *H01L 28/88* (2013.01); *H01L 28/91* (2013.01); *H01L 28/92* (2013.01); *H01F 2005/006* (2013.01); *H01F 2017/0073* (2013.01)

(58) Field of Classification Search
    CPC ......... H01L 28/87; H01L 28/88; H01L 28/91; H01L 28/92; H01F 17/0006; H01F 2005/006; H01F 2017/004; H01F 2017/0073; H01F 2017/0086
    See application file for complete search history.

(56) References Cited

U.S. PATENT DOCUMENTS

| | | | |
|---|---|---|---|
| 2003/0139015 A1* | 7/2003 | Chen | H01L 28/10 438/385 |
| 2005/0093667 A1* | 5/2005 | Kilian | H01F 41/046 336/200 |
| 2007/0164843 A1 | 7/2007 | Yagisawa et al. | |
| 2008/0122567 A1* | 5/2008 | Su | H01L 28/10 336/200 |
| 2008/0180880 A1* | 7/2008 | Okusawa | H01G 4/224 361/313 |
| 2009/0108403 A1* | 4/2009 | Gogoi | H01L 28/91 257/532 |
| 2015/0206662 A1* | 7/2015 | Lamy | H01G 4/38 174/260 |
| 2016/0163693 A1* | 6/2016 | Zhou | H01L 28/87 257/531 |
| 2016/0268144 A1 | 9/2016 | Voiron et al. | |
| 2016/0372449 A1* | 12/2016 | Rusu | H01L 25/0657 |
| 2017/0125398 A1* | 5/2017 | Nomura | H01L 29/866 |
| 2019/0006334 A1* | 1/2019 | Gardner | H01L 23/49816 |

FOREIGN PATENT DOCUMENTS

| | | |
|---|---|---|
| WO | 2007125510 A2 | 11/2007 |
| WO | 2007135620 A1 | 11/2007 |

OTHER PUBLICATIONS

Written Opinion of the International Searching Authority for PCT/EP2017/079668, dated Feb. 1, 2018.

\* cited by examiner

INTEGRATED ELECTRONIC COMPONENT SUITABLE FOR BROADBAND BIASING

CROSS REFERENCE TO RELATED APPLICATIONS

The present application is a continuation of PCT/EP2017/079668 filed Nov. 17, 2017, which claims priority to European Patent Application No. 16306553.5, filed Nov. 24, 2016, the entire contents of each of which are incorporated herein by reference.

TECHNICAL FIELD

The invention relates to an integrated electronic component for broadband biasing, a method for manufacturing the same and a transmission circuit that which comprises such integrated electronic component.

BACKGROUND

Bias tees are electronic circuits used to produce inter-stage voltage-biasing for high-frequency electrical modules such as amplifiers. They commonly comprise at least one inductor and at least one capacitor. FIG. 1 is an electrical diagram of such bias tee used for connecting an entrance module such as a RF-amplifier to a load. As shown, the electrical diagram includes the following elements: electronic circuit of the bias tee 10, entrance RF-amplifier 20, load 21, capacitor C of the bias tee, inductor L or the bias tee, input terminal 11 of the bias tee, bias terminal 12 of the bias tee, output terminal 13 of the bias tee, RF-signal at an input terminal of the entrance RF-amplifier, biasing DC-voltage VDD, and ground terminal G.

According to this design, the inductor L needs to have a low DC-impedance value and a high RF-impedance value so that the RF-signal is transmitted from the entrance RF-amplifier 20 to the load 21 with minimum loss. At the same time, the capacitor C needs to have a high DC-impedance value and a low RF-impedance value. More generally, the RF-frequency range used here for exemplifying purpose may be replaced by any targeted signal frequency range. In particular, for broadband applications such as optical transceivers, the lower frequency limit of the targeted signal frequency range may be as low as few megahertz (MHz), and even tens of kilohertz (kHz), and the upper limit of the targeted signal frequency range may be higher than 40 gigahertz (GHz). Such ultra-large frequency bandwidth leads to contradictory conditions for the capacitor C and the inductor L. Indeed, the lower frequency limit leads to using bulky components due to their high values available, such as tens of nanofarads (nF) and hundreds of nanohenrys (nH). At the same time, the upper frequency limit makes it preferable to use tiny components so that their parasitic coupling to the electrical environment of the bias tee circuit, including to a ground plane and neighboring electrical components, does not limit their dynamic behavior.

For these reasons, up to now ultra-large bandwidth bias tee circuits have been produced using discrete components. The capacitor is usually a multilayer ceramic capacitor which is soldered to electrically-conducting stripe segments of a printed circuit board (PCB). Then, the PCB stripe design and the capacitor package dimensions are selected so that their interaction features are under control. In this way, a transmission line is formed between an entrance module and a load module which ensures signal integrity up to tens of gigahertz (GHz).

The inductor is usually a wire-wound coil combined with a magnetic material core to increase the inductance value close to the lower limit of the targeted frequency range. The coil shape is also very special to address the issue of ultra-wide frequency band, as explained in document U.S. Patent Publication No. 2007/164843. The coil needs to have a conical shape, with a narrow end and a large end of the coil, so that the large coil end can be located further from a PCB ground plane than the narrow coil end. But such an inductor can only be soldered manually onto the PCB by an operator, and the exact placement and mounting angle of the conical coil relative to the PCB stripes are major issues for the gigahertz behavior of the bias tee and the reproducibility of the electrical and bandwidth features. In addition, such manual mounting operation is very expensive, and the circuit thus obtained can be rapidly damaged by mechanical vibrations acting onto the solder at the narrow end of the conical coil. Indeed, such vibrations are easily damaging due to the coil weight and its length of several millimeters (mm). Also the high-frequency behavior is limited by the ability to shape the smallest turn of the conical coil at the narrow coil end. It should be appreciated that the unit price of such a conical coil inductor is also very high.

The multilayer ceramic capacitor also has drawbacks. In particular, its thickness is significant, of several hundreds of micrometers ($\mu m$), and is responsible for local alteration of the interaction impedance of the transmission line with respect to the PCB ground plane. Possible parasitic coupling to adjacent electrical components may also be due to the large dimensions of the multilayer ceramic capacitor. For these reasons, it is difficult to predict a value for the interaction impedance of the transmission line.

SUMMARY OF THE INVENTION

In view of the foregoing, one object of the invention is to provide a new electronic circuit configured for broadband biasing, which avoids one or more of the drawbacks recited here-above. In particular, the invention aims at providing such a circuit at low unit price, and with electrical and frequency features which are highly reproducible for large production numbers.

Accordingly, an exemplary first aspect of the present invention proposes an integrated electronic component that is suitable for broadband biasing and which includes a monolithic substrate having two substrate surfaces which are planar and parallel; a trench network which extends into the substrate from one of the substrate surfaces called trench opening surface; at least one layered capacitor structure which extends in the trenches and between at least some of these trenches, the layered capacitor structure comprising at least two capacitor electrodes and at least one dielectric layer; and at least one inductor comprised of an electrically conducting wire arranged so as to form one or several turns with turn sections which increase from a narrow end of the inductor to a large end of the inductor opposite the narrow end; and at least three electrical terminals, comprising an input terminal which is connected electrically to the narrow end of the inductor and one of the capacitor electrodes, a bias terminal which is connected electrically to the large end of the inductor, and an output terminal which is connected electrically to the other one of the capacitor electrodes.

According to features of the exemplary embodiment of the present invention, at least one crater extends into the substrate from one of the substrate surfaces called crater opening surface, down to a bottom level of the crater, with a cross-section of the crater which decreases in size from the crater opening surface to the crater bottom level. The inductor wire is formed by a continuous track of an electrically-conducting material which is supported by a slanted peripheral wall of the crater and arranged so that the turns are substantially parallel to the crater opening surface. In this way, the turn sections decrease from the crater opening surface to the crater bottom level, the narrow and large inductor ends being situated at the crater bottom level and crater opening section, respectively.

The in-trench arrangement of the capacitor structure allows high capacitance values to be obtained, up to several hundreds of nanofarads per square-millimetre of substrate surface.

In addition, such integrated arrangement of the capacitor allows the capacitor to be less than one hundred micrometres in thickness, thereby allowing electrical features of the coupling of the capacitor to its electrical environment to be well-controlled. Such well-controlled coupling includes coupling to a ground stripe or plane of a PCB support, whatever its type, in particular grounded micro-stripe type, grounded back-plane type, co-planar type and grounded co-planar type, and also includes coupling to other adjacent electrical components.

Also the integrated arrangement of the inductor allows well-known mass-production and cost-efficient manufacturing processes to be used, such as selective etching and material deposition processes. In addition, such integrated arrangement of the inductor is much less sensitive to mechanical vibrations than a wire-wounded coil.

Yet further, the integrated arrangement of the inductor is compatible with obtaining the desired electrical behaviour in the frequency band from 4 GHz (gigahertz) to 40 GHz. The range from 40 MHz (megahertz) to 4 GHz can be handled with cheap inductor components which are widely available.

In an exemplary aspect, the crater is symmetrical with respect to an axis which is perpendicular to the substrate surfaces. In such cases, the sections of the crater perpendicular to the crater axis may have a triangular, square, rectangular, hexagonal or disk shapes.

Generally for the exemplary embodiments of the present invention, the crater bottom level can be situated at the trench opening surface according to one exemplary aspect. In this case, the narrow inductor end may be connected electrically to one of the capacitor electrodes through a crater bottom by a connection track which is contained in a metallization layer arranged above the trench opening surface. Such arrangement is optimized for manufacturing and cost issues.

Moreover, in certain first exemplary embodiments of the present invention, the crater opening surface and the trench opening surface are opposite surfaces for the substrate, and the crater section at the crater opening surface overlaps the trench network in projection into a plane parallel to the substrate surfaces. Dimensions of the component may be reduced in this way. In addition for such first embodiments, the input and output terminals may be both located above the trench opening surface, and the bias terminal may be located above the crater opening surface, all three terminals being supported rigidly by the substrate.

In certain second exemplary embodiments of the present invention, the monolithic substrate comprises a base substrate and an upper substrate structure which is stacked on the base substrate. In this case, the trench opening surface may be intermediate between the base substrate and the upper substrate structure, and the trench network extends into the base substrate. The crater opening surface extends at a side of the upper substrate structure which may be opposite the base substrate, and the crater extends into the upper substrate structure. Furthermore, the narrow inductor end may be connected electrically to one of the capacitor electrodes through a crater bottom by a connection track which extends between the base substrate and the upper substrate structure. Also for such second embodiments, the crater section at the crater opening surface may overlap the trench network in projection into a plane parallel to the substrate surfaces. In addition for the second embodiments, the input and output terminals may be both located on a face of the base substrate which is opposite the trench opening surface and the upper substrate structure, and connected to the capacitor electrodes through the base substrate. The bias terminal may be located above the crater opening surface. All three terminals are supported rigidly by the substrate again.

It is noted that according to variations of the exemplary embodiments, one or more of the following additional features may be provided, including, the input and output terminals of the integrated electronic component may be suitable for soldering to a printed circuit board; the layered capacitor structure may have a capacitor value higher than 1 pF (picofarad), preferably comprised between 1 nF (nanofarad) and 200 nF, and the inductor may have an inductance value higher than 10 pH (picohenry), preferably comprised between 1 nH (nanohenry) and 50 nH; a thickness of the integrated electronic component measured perpendicular to the substrate surfaces may be less than 1 mm (millimeter), preferably less than 300 μm (micrometer); and that the crater section at the crater opening surface may be contained within a 2 mm-sided square, preferably within a 300 μm-sided square.

Also generally and optionally, the integrated electronic component may further comprise an additional crater which extends into the substrate also from the crater opening surface, with a section of this additional crater which decreases from the crater opening surface; and an additional inductor comprised of another continuous track of electrically conducting material which is supported by a slanted peripheral wall of the additional crater and arranged so that turns of the another continuous track are substantially parallel to the crater opening surface with turn sections decreasing from the crater opening surface.

For such multi-inductor configuration of the component, a large end of the additional inductor which is situated at the crater opening surface is connected electrically to another bias terminal of the integrated electronic component, and a narrow end of the additional inductor is connected electrically to the output terminal of the integrated electronic component. The another bias terminal may also be located above the crater opening surface, and rigidly connected thereto.

According to another exemplary aspect, each crater of the integrated electronic component can be arranged within this component so as to extend symmetrically on both sides of a plane which contains respective mounting axes of the input terminal and output terminal.

A second exemplary aspect of the present invention provides a method for manufacturing an integrated electronic component suitable for broadband biasing, which comprises etching at least one trench network into a monolithic substrate having two substrate surfaces which are planar and parallel, from one of these substrate surfaces called trench opening surface; forming a layered capacitor structure which extends in the trenches and between at least some of these trenches, this layered capacitor structure comprising at least two capacitor electrodes and at least one dielectric layer; forming at least one crater into the substrate from one of the substrate surfaces called crater opening surface, down to a crater bottom level so that a section of the crater decreases from the crater opening surface to the crater bottom level; optionally covering the substrate within the crater with a film of an electrically insulating material, so that a slanted peripheral surface of the crater is formed by a concave exposed surface of the film; producing an inductor as a continuous track of an electrically conducting material supported by the slanted peripheral wall of the crater so that the track forms one or several turns substantially parallel to the crater opening surface with turn sections which decrease from the crater opening surface to the crater bottom level, opposite narrow and large inductor ends being situated at the crater bottom level and crater opening surface, respectively; connecting electrically the narrow inductor end and one of the capacitor electrodes to an input terminal of the integrated electronic component, the large inductor end to a bias terminal of this integrated electronic component, and the other one of the capacitor electrodes to an output terminal of the integrated electronic component; and optionally, depositing a protection layer on the inductor, into the crater.

This exemplary manufacturing method can be adapted in the following manner for obtaining components according to the first exemplary embodiments recited above: the trench network is etched as a first step; then the layered capacitor structure is formed; then the method comprises forming at least one metallization layer and the input and output terminals above the trench opening surface, so that the capacitor electrodes are connected electrically to the input and output terminals, respectively; then the method further comprises reducing a thickness of the monolithic substrate, by removing substrate material on a side of this substrate opposite the trench opening surface, so as to form the crater opening surface parallel with the trench opening surface, the thickness of the substrate being measured perpendicular to the trench opening surface; then the crater is etched from the crater opening surface, preferably; then the substrate may be optionally covered within the crater with the film of electrically insulating material; then the continuous track of electrically conducting material is produced on the slanted peripheral wall of the crater, so that the narrow inductor end is connected to the input terminal through an electrically conducting track contained in the at least one metallization layer; and forming the bias terminal above the crater opening surface and connecting electrically this bias terminal to the large end of the inductor.

In one exemplary aspect, the crater preferably is etched until the crater bottom level.

In one exemplary aspect, the substrate thickness preferably may be reduced using a grinding process.

In one exemplary aspect, the crater may be etched using a first mask which is formed on the crater opening surface and has an aperture corresponding to the section of the crater at this crater opening surface, and using a chemical etching process for removing substrate material selectively through the aperture of the first mask.

Alternatively, the manufacturing method may be adapted for obtaining components according to the above-mentioned second embodiments, using the base substrate and the upper substrate structure. In such cases, the method may comprise: trench network being etched into the base substrate, from one surface thereof which forms the trench opening surface, and two through-vias are formed through the base substrate, these through-vias extending from the trench opening surface to a back surface of the base substrate which is opposite the trench opening surface; then the layered capacitor structure is formed; then the method comprises forming at least one metallization layer above the trench opening surface, so as to connect electrically one-to-one the capacitor electrodes to the through-vias; the input and an output terminals are formed on the back surface of the base substrate, so that they are connected electrically one-to-one to the through-vias; the method also comprises forming an upper substrate structure on the base substrate, above the trench opening surface and rigidly connected to this latter, the upper substrate structure being provided with the crater at a surface of this upper substrate structure which may be opposite the base substrate and forms the crater opening surface; then the continuous track of electrically conducting material is produced on the slanted peripheral wall of the crater, so that the narrow inductor end is connected to the input terminal through an electrically conducting track contained in the at least one metallization layer; and the bias terminal is formed above the crater opening surface and connected electrically to the large end of the inductor.

Generally, and optionally, in the manufacturing method according to the present invention, the continuous track of electrically conducting material can be produced by: depositing a seed layer of an electrically conducting material on the slanted peripheral wall of the crater; depositing a second mask on the seed layer, with an aperture of this second mask which corresponds to the continuous track; depositing the electrically conducting material of the continuous track on the seed layer through the aperture of the second mask, using an electroplating process with electrical current supplied to the seed layer; and removing the second mask and a portion of the seed layer which is exposed once the second mask has been removed.

A third exemplary aspect of the present invention proposes an electrical signal transmission circuit, which comprises a printed circuit board having two separate transmission stripe segments which have respective ends close to each other; a DC-voltage source having a DC-output terminal; and an integrated electronic component according to the first aspect of the invention, wherein the input and output terminals of the integrated electronic component are soldered to both ends of the transmission stripe segments, so that the integrated electronic component bridges between these ends of the transmission stripe segments, and the bias terminal of the integrated electronic component is connected electrically to the DC-output terminal of the DC-voltage source.

In this exemplary aspect, both transmission stripe segments together with the integrated electronic component form a continuous signal transmission line.

Moreover, in one aspect, the printed circuit board can further have a reference stripe that extends parallel to a first one of the transmission stripe segments, further extends parallel to part of the integrated electronic component between its input and output terminals, and further extends parallel to the other one of the transmission stripe segments. For such stripe configuration of the PCB, a local interaction impedance existing between the signal transmission line and the reference stripe may exhibit a value at the integrated electronic component which is within 75%-125%, preferably 90-110%, of a reference value which exists at the transmission stripe segments for this local interaction impedance.

In addition, the integrated electronic component can be advantageously designed so that each crater extends symmetrically on both sides of a plane which is perpendicular to the printed circuit board and contains both ends of the transmission stripe segments. Interactions between each inductor of the component and the PCB stripes can be reduced in this way.

These and other features of the invention will be now described with reference to the appended figures, which relate to preferred but not-limiting embodiments of the invention.

BRIEF DESCRIPTION OF THE DRAWINGS

It is noted that for clarity sake, element sizes which appear in these figures do not correspond to actual dimensions or dimension ratios. Also, same reference signs which are indicated in different ones of these figures denote identical elements or elements with similar functions.

DETAILED DESCRIPTION

Figure 1:
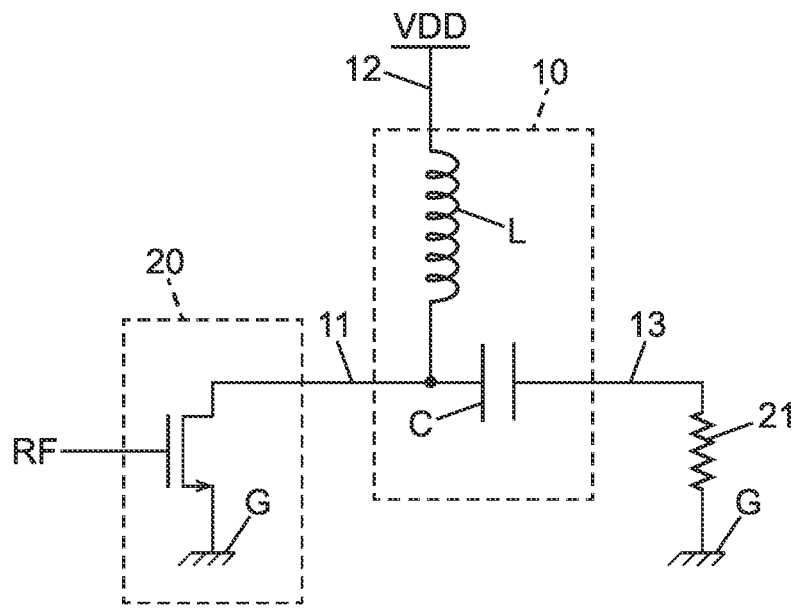
FIG. 1 is an electrical diagram of a component suitable for broadband biasing, being an example of a component that can be provided in accordance with an exemplary aspect of the present invention.

FIG. 1 already described applies to the exemplary embodiments presented below unless stated otherwise. In particular, it applies to the exemplary embodiments illustrated by FIGS. 4 and 5.

Figure 2:
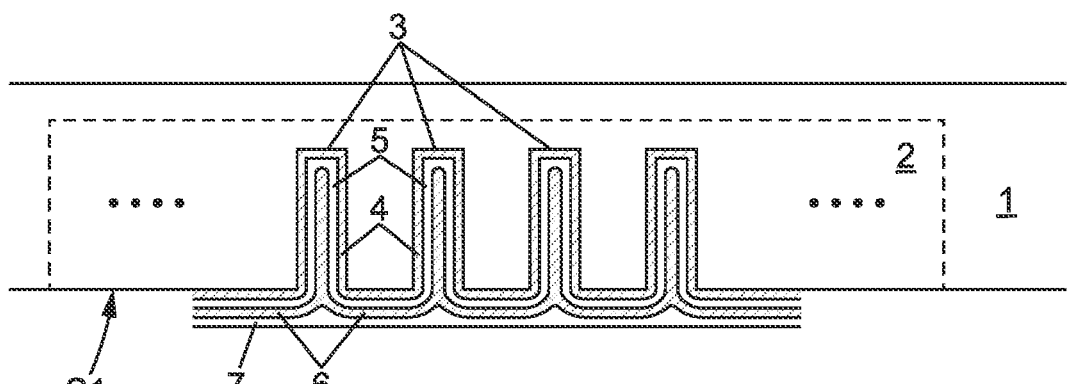
FIG. 2 is a cross-sectional view of a capacitor structure as contained in an integrated electronic component in an example in accordance with an exemplary aspect of the present invention.

According to FIG. 2, a layered capacitor structure comprises two electrically conductive layers 4 and 6, and an electrically insulating layer 5 which is intermediate between the conductive layers 4 and 6. A substrate 1 is appropriate for producing a trench network comprised of trenches 3 which may have any trench pattern. For example, the substrate 1 may be of doped silicon with a doping well 2 for creating a diode-based electrical insulation between inside and outside of the well 2. But such insulation is optional and a substrate which has high resistivity across its entire volume may be used alternatively. The trenches 3 extend into the volume of the substrate 1, or into the well 2, from one planar surface of the substrate 1 which is called trench opening surface and has reference sign S1. Well-known directional etching processes such as dry etching or reactive ion etching may be used for forming the trenches 3 from the trench opening surface S1, down to a trench bottom level measured perpendicular to the trench opening surface S1. The electrically conductive layer 4 is first deposited in the trenches 3 and between these latter, so as to form a continuous film which covers the substrate 1 within the trenches 3 and at the trench opening surface S1. The layer 4 forms a first capacitor electrode. Possibly, an electrically insulating film may be deposited before the layer 4, so as to isolate the first capacitor electrode from the substrate material. Alternatively when the well 2 is implemented, the doped substrate material within the well 2 may directly form the layer 4. Then, the electrically insulating layer 5 is formed on the layer 4, and an additional electrically conductive layer 6 is deposited on the layer 5. Layer 5 forms the capacitor dielectric layer, and layer 6 forms another capacitor electrode. Materials for layers 4, 5 and 6 may be polysilicon or metal, silicon dioxide ($SiO_2$) and polysilicon or metal, respectively. Such layered capacitor structure was known before the present invention, so that there is no need to provide more details here. The trenches 3 may be etched using masking and a dry etching process. The layers 4 and 6 may be deposited using a chemical vapor deposition (CVD) process or an atomic layer deposition (ALD) process, and the layer 5 may be obtained by surface-oxidation of the material of the layer 4. Such processes are also well-known in the art. The in-trench arrangement of the layered capacitor structure allows obtaining capacitor surface density up to several hundreds of nanofarads per square-millimetre ($nF/mm^2$) of substrate surface. Thus, the capacitor structure may have a capacitor value of about 10 nF for instance. A protective layer 7 may be further deposited on the whole layered capacitor structure, for example using a silica low-pressure deposition process.

Both capacitor electrodes 4 and 6 are to be connected electrically to respective soldering pads which are located on one surface of the substrate, and dedicated to form the input terminal 11 and the output terminal 13. Designs and manufacturing methods for such soldering pads and connections thereto are well-known in the art, so that it is not necessary to describe them again here.

Figure 3A:
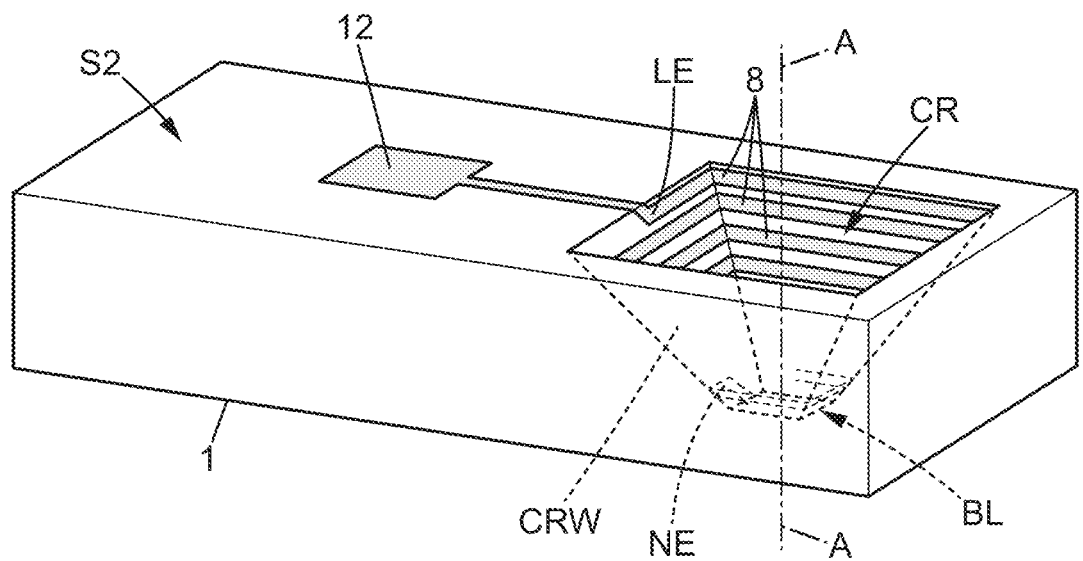
FIGS. 3a and 3b are respectively a perspective view and a top view of an inductor as contained in an integrated electronic component in an example in accordance with an exemplary aspect of the present invention.
Figure 3B:
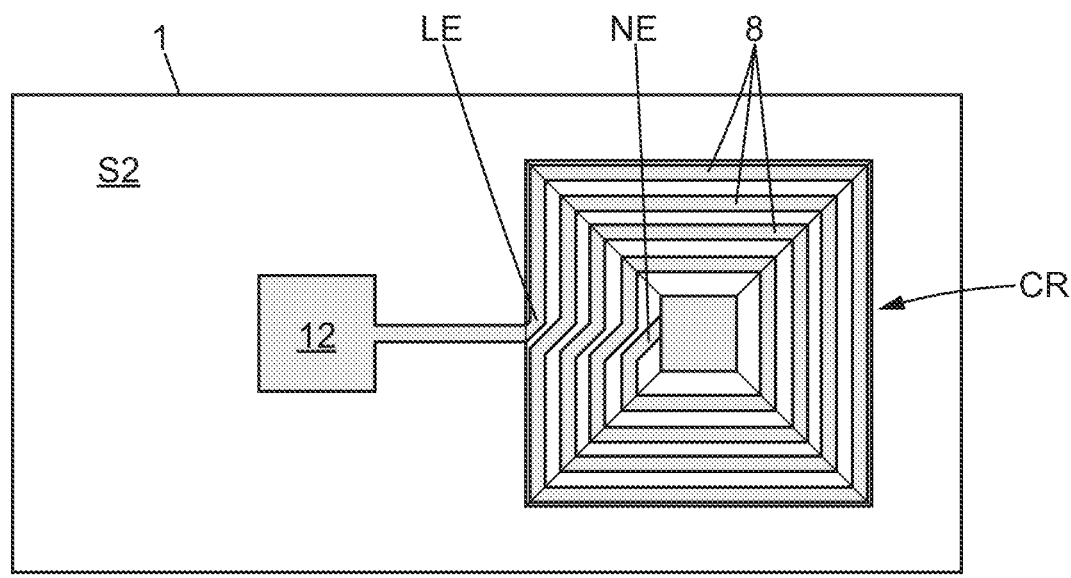

According to FIGS. 3a and 3b, a crater CR is formed into the substrate 1 from one planar surface thereof which has been called crater opening surface and denoted S2. Thus, the crater CR has a largest section at the crater opening surface S2, and a smallest section at a crater bottom level BL which is situated within the crater CR at the greatest distance from the crater opening surface S2. The inner peripheral wall CRW of the crater CR is slanted with respect to a direction perpendicular to the crater opening surface S2, so that the crater CR forms a concave surface portion of the substrate 1 from the crater opening surface S2. Typical dimensions for the crater CR are 340 μm (micrometer)×340 μm when it has a square shape parallel to the crater opening surface S2. Alternatively, the crater shape parallel to the crater opening surface S2 may be triangular, rectangular, hexagonal, disklike, all these shapes having a symmetry axis A-A which is perpendicular to the crater opening surface S2. But such symmetry axis is not compulsory for the invention, although it may be advantageous for design and manufacturing matters, and also for coupling reduction issues. Depth of the crater CR may be of about 300 μm for example. Several processes may be used for forming the crater CR into the substrate 1, depending on the substrate material at the crater location. Examples for such crater-forming processes will be provided later on for the embodiments of FIGS. 4 and 5.

A coil of electrically conducting material 8 is arranged on the slanted peripheral wall CRW of the crater CR. The coil 8 is comprised of a continuous track of the conducting material, which forms a plurality of coil turns each substantially parallel to the crater opening surface S2, and shifted from one another along the direction perpendicular to the crater opening surface S2. Adjacent turns are connected end-to-end to one another so as to form the continuous electrically-conducting track which is supported by the slanted peripheral wall CRW of the crater CR. Turn section decreases progressively from the crater opening surface S2 to the crater bottom level BL. In addition, the large end LE of the coil 8 at the crater opening surface S2 is connected electrically to a soldering pad which is formed on the crater opening surface S2 outside the crater CR. This latter soldering pad forms the bias terminal 12. The narrow end NE of the coil 8 is to be connected to the input terminal 11 of the component 10 using an electrically conducting path arranged through the bottom of the crater CR. A typical inductor value for such in-crater coil 8 is about 10 nH.

An example method for manufacturing such in-crater coil 8 is now described. Once the crater CR has been formed in the substrate 1 from the crater opening surface S2, it is possible to deposit a film 8i (FIG. 4) of an electrically insulating material on the slanted peripheral wall CRW of the crater CR, and also possibly on the crater opening surface S2 outside the crater CR. Such insulating film 8i is necessary when the substrate material is electrically conductive at the location of the crater CR, but it may be not necessary if the substrate material at this location is electrically insulating. Plasma-enhanced or low-pressure chemical vapour deposition processes (PECVD or LPCVD) may be implemented for depositing silica ($SiO_2$) in order to form the insulating film 8i. Alternatively, the insulating film 8i may be obtained by surface-oxidation of the exposed substrate material.

Then, a thin layer of an electrically conducting material is deposited on the slanted peripheral wall CRW of the crater CR. Such thin layer may be a copper (Cu) layer, for example, with thickness of about 10 nm (nanometer). Physical vacuum deposition (PVD) processes or metal-organic chemical vapor deposition (MOCVD) processes may be implemented for such thin metal layer. Possibly, a barrier layer may be implemented between the substrate material and the electrically conducting material for preventing that this latter, in particular copper, diffuses or migrates into the substrate material. Possible barrier layer materials are titanium (Ti), titanium nitride (TiN), tantalum nitride (TaN), and others well known in the art. Thereafter, a mask is formed on this electrically conductive layer, with a mask aperture which corresponds to the continuous track of the coil 8 to be manufactured. Usual masking processes may be implemented to this end, provided that the mask aperture can be patterned obliquely on the slanted peripheral wall CRW of the crater CR. For example, a photosensitive resist may be deposited in the crater CR using vacuum resist lamination, spray coating, spin coating, etc. Electrophoretic resist may be used as well. Then photolithography with long depth of field using one or several exposures can be implemented for forming the mask aperture pattern. Electron beam exposure can be used alternatively. Finally, a development step provides the mask aperture with the desired pattern. Thereafter, an electroplating process may be implemented for depositing additional electrically conducting material on the thin layer of electrically conducting material used a seed layer, through the mask aperture. To this end, the substrate is immersed into an electroplating solution and electrical current is supplied to the seed layer within the crater CR. The metal deposited in this way may be again copper (Cu) or aluminum (Al). The mask resist may then be stripped, and the seed layer is removed at locations previously covered by the resist. The electrical connection from the large end LE of the coil-forming track 8 to the bias terminal 12 may be manufactured at the same time by the electroplating process. Typically, cross-sectional dimensions or the coil-forming track 8 may be few micrometers, for example between 1 and 50 µm, for the track width and also few micrometers, for example between 1 and 10 µm, for the track thickness. Then a continuous protection layer 9 may be deposited into the crater CR, on the coil 8 and the spaces between the coil turns, for ensuring that no chemical alteration due to external elements or compounds may affect the inductance-forming coil 8.

Figure 4:
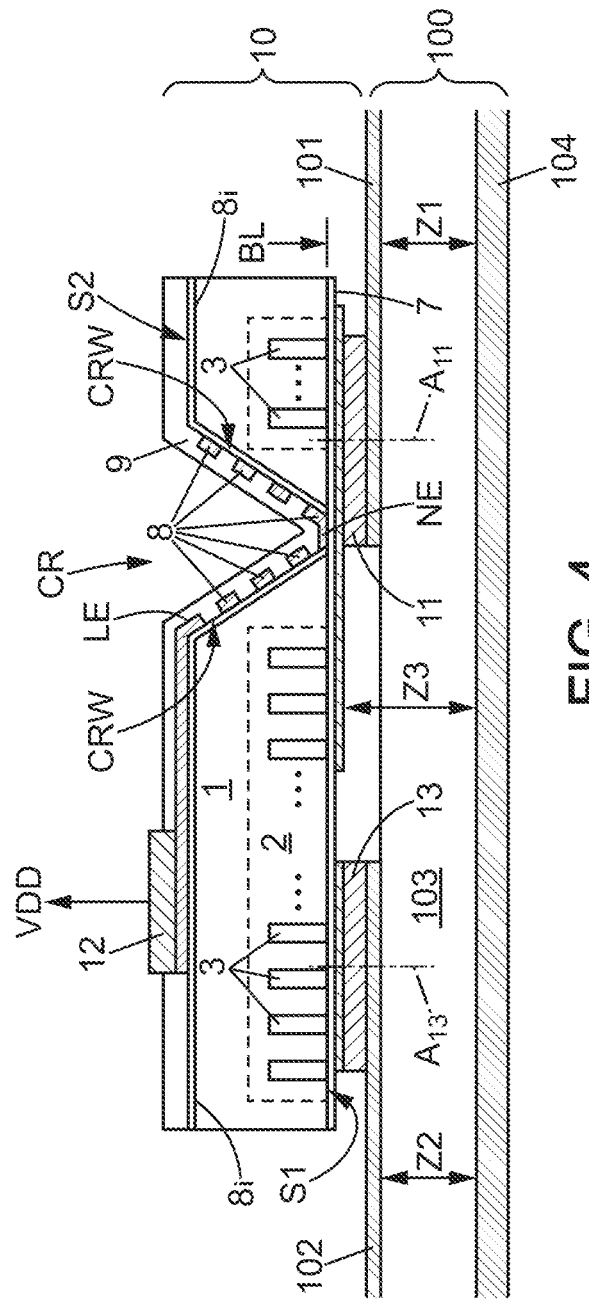
FIG. 4 is a cross-sectional view of an integrated electronic component in accordance with a first exemplary embodiment type of the invention.

The first embodiment illustrated by FIG. 4 corresponds to the case in which the trench opening surface S1 and the crater opening surface S2 are opposite planar surfaces of a semiconductor substrate 1. The substrate 1 may be part of a silicon wafer. Reference number 10 denotes the component for broadband biasing, also called bias tee. It comprises the elements already described with reference to FIGS. 2, 3a and 3b, including the protective layers 7 and 9, and the terminal-forming pads 11, 12 and 13. In an exemplary aspect, a method for manufacturing such bias tee is described, without describing in detail processes which are well-known and implemented without special adaptation beyond natural ones.

In particular, the trenches 3 are etched at first, into the substrate 1, within the well 2 if any, and the layers 4-6 of the capacitor structure and also the capacitor protective layer 7 are formed as already described with reference to FIG. 2. Possibly, the trenches 3 and the capacitor structure may be distributed into several areas of the trench opening surface S1 apart from each other, but the resulting plurality of trench-capacitor structures are then connected in parallel so as to form in total the capacitor C.

Moreover, at least one metallization layer (not shown in FIG. 4) is formed on the protective layer 7, and also the input terminal 11 and the output terminal 13 on the metallization layer, so that the terminals 11 and 13 are electrically connected one-to-one to both layers 4 and 6. The design and production of such metallization layer in accordance with the electrical diagram of FIG. 1, may be any in the scope of the Man skilled in the art.

Then, the substrate 1 may be reduced in thickness by removing substrate material, for example using a grinding process, on the substrate side opposite the trench opening surface S1. This material removal produces the crater opening surface S2 parallel to the trench opening surface S1.

A first mask which has an aperture corresponding to the section at the crater opening surface S2, of the crater to be formed, is produced on this crater opening surface S2. Then, an etching process such as a wet chemical etching process is implemented to form the crater CR into the substrate 1, through the aperture of the first mask. In this way, the crater CR can be produced directly with a slanted peripheral wall CRW originating from the peripheral edge of the mask aperture. The slanting angle of the crater peripheral wall CRW depends on actual etching conditions, but a value of between 30° and 60° may be obtained, relative to a direction normal to the crater opening surface S2. The etching process is continued until the crater bottom level BL reaches the trench opening surface S1 at a location where the metallization layer has been provided with an electrically conducting contact element, for example a metal contact element. This contact element is thus exposed through the crater CR from the crater opening surface S2.

Because the substrate 1 may be electrically conducting or have a residual electrical conductivity about the crater CR, it is necessary to produce the electrically insulating film 8i on the slanted peripheral wall CRW, as already described.

In addition, the coil 8 is formed in the crater CR as already described with reference to FIGS. 3a and 3b. The mask used for defining the coil pattern has been called second mask in the general part of the invention description. It is formed so that the narrow end NE of the coil 8 is in electrical contact with the in-crater exposed contact element. An electrical connection is formed simultaneously on the crater opening surface S2, for linking the bias terminal 12 to be produced to the large end LE of the coil 8. The protective layer 9 is also deposited at least into the crater CR; and the bias terminal 12 is produced on the crater opening surface S2.

For reducing the overall dimensions of the bias tee 10, the crater CR may overlap some of the trenches 3 in projection into a common plane parallel to both the trench opening surface S1 and the crater opening surface S2.

Figure 5:
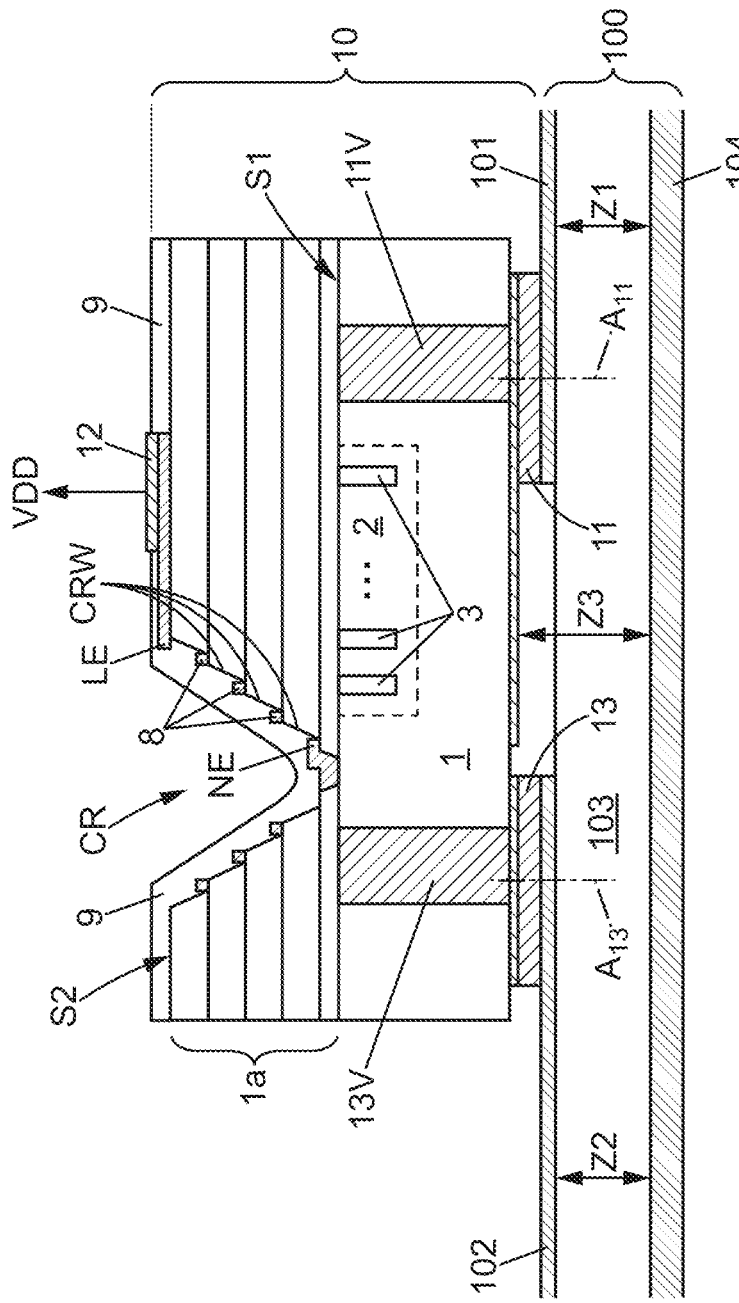
FIG. 5 corresponds to FIG. 4 for a second exemplary embodiment type of the invention.

The second embodiment illustrated by FIG. 5 corresponds to the case in which the substrate of the complete bias tee 10 is comprised of a base substrate and an upper substrate structure 1a which are stacked on one another. The surface of the upper surface structure 1a which is opposite the base substrate forms the crater opening surface S2. One possible method for manufacturing such biasing tee may include forming the trenches 3, the capacitor structure and the protective layer 7 as already described with reference to FIG. 2, from the trench opening surface S1 of the substrate 1. At this stage of the manufacturing process, the substrate 1 is devoid of the upper substrate structure 1a. It will form the base substrate in the complete structure of the bias tee 10; and forming the through-vias 11V and 13V through the substrate 1, by implementing masking, etching, and material deposition processes. The inner wall of the through-vias 11V and 13V may be covered with electrically insulating material before they are filled with electrically conducting material, and thereafter the through-via filling is performed using conducting material such as polysilicon.

In addition, at least one metallization layer (not shown in FIG. 5) is formed on the protective layer 7, so that the through-vias 11V and 13V are electrically connected one-to-one to both layers 4 and 6.

Then, the upper substrate structure 1a is formed on the metallization layer, namely above the trench opening surface S1 of the substrate 1. The substrate 1 thus forms the base substrate mentioned previously. The upper substrate structure 1a is connected rigidly to the base substrate above the trench opening surface S1 as now explained. According to a first variant of such second embodiment, represented in FIG. 5, the upper substrate structure 1a may be comprised of a series of superposed unit layers of a photoresist material. Each unit layer then has a respective aperture which matches a section of the crater CR at the height level of this unit layer of photoresist material. So the apertures of the photoresist unit layers increase progressively from the first unit layer closest to the substrate 1, to the last unit layer furthest to the substrate 1. The crater opening surface S2 is then the exposed surface of the last photoresist unit layer. It is thus parallel to the trench opening surface S1. According to another variant of the second embodiment, the upper substrate structure 1a may be comprised of an additional substrate, for example an additional semiconductor substrate, which is adhered to the metallization layer above the trench opening surface S1. The additional substrate has parallel planar surfaces, one of which is adhered to the trench opening surface S1, and the other one forming the crater opening surface S2. In such case, the crater CR may be formed into the upper substrate structure 1a in a similar manner as for the first embodiment of the invention, including forming an electrically insulating film within the crater CR. Generally for all second embodiments, the crater CR may overlap again some of the trenches 3 in projection into a common plane which is parallel to both the trench opening surface S1 and the crater opening surface S2.

Then, the coil 8, the bias terminal 12, the electrical connection between these latter and the protective layer 9 may be formed in the crater CR and on the crater opening surface S2 as described with reference to FIGS. 3a and 3b; and the input terminal 11 and the output terminal 13 are formed on the back surface of the substrate 1 so as to be electrically connected one-to-one to the through-vias 11V and 13V. Possibly, such step of forming the terminals 11 and 13 may be implemented earlier in the process, in particular before forming the upper substrate structure 1a.

In both FIGS. 4 and 5, reference number 100 denotes a printed circuit board (PCB) with an insulating PCB support 103, a first transmission stripe segment 101, a second transmission stripe segment 102 and a reference stripe 104. In the examples illustrated, the transmission stripe segments 101 and 102 are situated on the PCB top face, and the reference stripe 104 is situated on the PCB back face. The bias tee component 10 according to an example of the invention is mounted on the PCB 100, with the input terminal 11 soldered to an end of the first transmission stripe segment 101, and the output terminal 13 soldered to an end of the second transmission stripe segment 102. The bias terminal 12 of the component 10 is connected to a DC-output terminal of a DC-voltage source (not shown), using an electrically conducting wire soldered at a first end thereof to the bias terminal 12. A second end of this wire is connected to the DC-output terminal of the DC-voltage source. The PCB 100, the bias tee component 10 thus connected and the DC-voltage source form an electrical signal transmission circuit, and both transmission stripe segments 101, 102 together with the bias tee component 10 form a continuous signal transmission line.

Most often, the reference stripe 104 is connected to a ground terminal of the DC-voltage source. The reference stripe 104 extends below and parallel to the transmission stripe segments 101 and 102. Depending on the PCB type, the reference stripe 104 may be replaced by an electrically conducting plane on the PCB back face. Z1, Z2 and Z3 denote values of the local interaction impedance which exists between the reference stripe 104 and the signal transmission line, at several locations along this latter. Because the signal transmission line is modified locally by the bias tee component 10 as compared to the transmission stripe segments 101 and 102, the value of the local interaction impedance at the bias tee component 10 may be different than another value of the local interaction impedance which exists at the transmission stripe segments 101 and 102. Z1 and Z2 are the values at the transmission stripe segments 101 and 102, respectively. The PCB 100 is commonly designed so that these values Z1 and Z2 are almost equal to each other, most often equal to 50 Ohm. Because the bias tee component 10 when designed according to the invention can have a thickness relative to the PCB top face which is very low, typically of few hundreds of micrometers, the value Z3 of the local interaction impedance at the location of the bias tee component 10 may be within 90%-110% of the values Z1 and Z2. In this way, the bias tee component 10 included in the signal transmission line does not generate significant back-reflection of the signal which is to be transmitted from the transmission stripe segment 101 to the transmission stripe segment 102. For further reducing such back reflection, the bias tee component 10 may be provided on its lower face with a metal extension from one of its input and output terminals 11, 13 toward the other one of these terminals 11 and 13 but without shorting them.

Advantageously, for reducing an interaction contribution which is due to the coil 8 with respect to the PCB 100, the bias tee component 10 may be designed so that the crater CR extends symmetrically on both sides of a plane which is perpendicular to the PCB 100 and contains both ends of the transmission stripe segments 101 and 102. Put another way, the crater CR is arranged within the bias tee component 10 so as to extend symmetrically on both sides of a plane which contains respective mounting axes of the input terminal 11 and output terminal 13. In FIGS. 4 and 5, the mounting axes are denoted $A_{11}$ and $A_{13}$ for the input terminal 11 and the output terminal 13 respectively.

Figure 6:
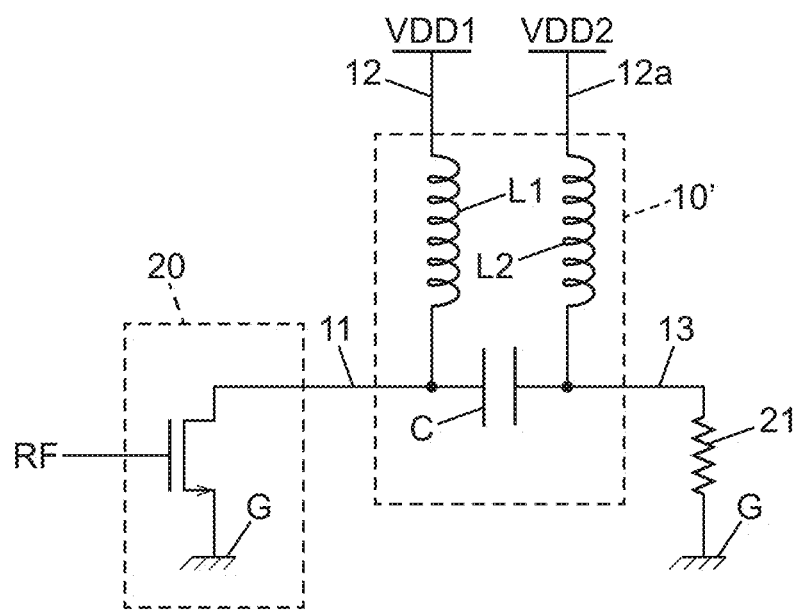
FIG. 6 corresponds to FIG. 1 for additional exemplary embodiments of the invention.
Figure 7:
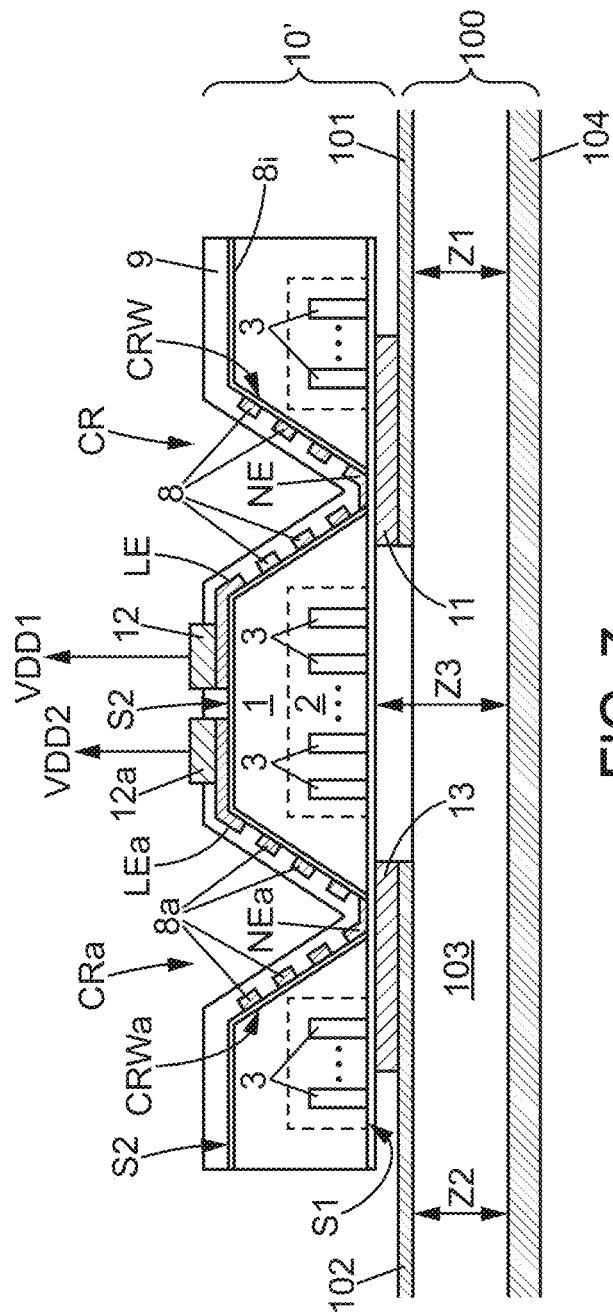
FIG. 7 corresponds to FIG. 4 for an additional exemplary embodiment in accordance with FIG. 6.

FIGS. 6 and 7 relate to a bias tee component 10' which has two inductors denoted L1 and L2 (see in FIG. 6). The inductor L1 is to be connected between the input terminal 11 of the bias tee component and a first DC-voltage source which produces a first DC biasing voltage VDD1, and the inductor L2 is to be connected between the output terminal 13 of the bias tee component 10' and a second DC-voltage source which produces a second biasing voltage VDD2. Actually, the inductor L1 corresponds to that denoted L in FIG. 1, and the inductor L2 is added. FIG. 7 is a cross-sectional view of such modified bias tee component 10', also in accordance with an example of the present invention. It may be adapted again for mounting onto the PCB 100. The bias tee component 10' may be provided with two separate craters CR and CRa both located at one and same crater opening surface S2 of the component 10'. The inductor L1 is associated with the crater CR, the coil 8 and the bias terminal 12 in a similar manner as before, and the inductor L2 is associated with the additional crater CRa, an additional coil 8*a* and an additional bias terminal 12*a*. The additional coil 8*a*, the additional bias terminal 12*a* and an additional electrical connection for linking the additional coil 8*a* to one of the capacitor electrodes and to the additional bias terminal 12*a*, may be designed and produced in a way similar to those for the coil 8 and the bias terminal 12. NEa and LEa denote respectively the narrow end and the large end of the additional coil 8*a*.

It should be understood that the invention may be reproduced while adapting or modifying some of its secondary aspects with respect to the embodiments described hereabove. In particular, design features, materials and the numeral values cited may be modified.

What is claimed:

1. An integrated electronic component for broadband biasing, the integrated electronic component comprising:
   a substrate having two substrate surfaces that are planar and parallel;
   a trench network having a plurality of trenches that extend into the substrate from a trench opening surface of the two substrate surfaces;
   at least one layered capacitor structure having a plurality of layers that extend into the plurality of trenches and between at least some of the plurality of trenches, the layered capacitor structure comprising at least two capacitor electrodes and at least one dielectric layer;
   at least one inductor having an electrically conducting wire arranged to form one or several turns with turn sections that increase from a narrow end of the inductor to a large end of the inductor opposite the narrow end; and
   at least three electrical terminals having an input terminal connected electrically to the narrow end of the inductor and one of the at least two capacitor electrodes, a bias terminal connected electrically to the large end of the inductor, and an output terminal connected electrically to the other of the at least two capacitor electrodes,
   wherein at least one crater extends into the substrate from a crater opening surface to a bottom level of the at least one crater, with the crater opening surface being one of the two substrate surfaces that opposes the trench opening surface,
   wherein a section of the at least one crater decreases from the crater opening surface to the bottom level of the at least one crater, and the inductor wire formed by a continuous track of an electrically conducting material is supported by a slanted peripheral wall of the at least one crater and configured so that the turns are parallel to the crater opening surface with respective turn sections decreasing from the crater opening surface to the bottom level of the at least one crater, and
   wherein the narrow and large inductor ends are situated at the crater bottom level and the crater opening surface, respectively.

2. The integrated electronic component according to claim 1, wherein the crater bottom level is situated at the trench opening surface, and the narrow inductor end is connected electrically to the one of the at least two capacitor electrodes through a crater bottom by a connection track that is contained in a metallization layer arranged above the trench opening surface.

3. The integrated electronic component according to claim 1, wherein the crater opening surface and the trench opening surface are the respective opposite surfaces of the substrate, and the section of the at least one crater at the crater opening surface overlaps the trench network in projection into a plane parallel to the substrate surfaces.

4. The integrated electronic component according to claim 3, wherein the input and output terminals are both located above the trench opening surface, and the bias terminal is located above the crater opening surface, with all three terminals being supported rigidly by the substrate.

5. The integrated electronic component according to claim 1, wherein the substrate comprises a base substrate and an upper substrate structure stacked on the base substrate, the trench opening surface is between the base substrate and the upper substrate structure, the trench network extends into the base substrate, the crater opening surface extends at a side of the upper substrate structure opposite the base substrate, the crater extends into the upper substrate structure, and the narrow inductor end is connected electrically to the one of the at least two capacitor electrodes through a crater bottom by a connection track that extends between the base substrate and the upper substrate structure.

6. The integrated electronic component according to claim 5, wherein the input and output terminals are both located on a face of the base substrate that is opposite the trench opening surface and the upper substrate structure, and are connected to the capacitor electrodes through the base substrate, and the bias terminal is located above the crater opening surface, with all three terminals being supported rigidly by the substrate.

7. The integrated electronic component according to claim 1, wherein the input and output terminals of the integrated electronic component are configured for soldering to a printed circuit board.

8. The integrated electronic component according to claim 1, further comprising:
   an additional crater that extends into the substrate from the crater opening surface, with a section of the additional crater decreasing from the crater opening surface; and
   an additional inductor comprised of another continuous track of electrically conducting material that is supported by a slanted peripheral wall of the additional crater and arranged so that turns of the another continuous track are parallel to the crater opening surface with turn sections decreasing from the crater opening surface, wherein a large end of the additional inductor situated at the crater opening surface is connected electrically to another bias terminal of the integrated electronic component, and a narrow end of the additional inductor is connected electrically to the output terminal of the integrated electronic component.

9. The integrated electronic component according to claim 8, wherein each of the at least one crater and the additional crater is arranged within the component so as to extend symmetrically on both sides of a plane that contains respective mounting axes of the input terminal and output terminal.

10. An electrical signal transmission circuit, comprising:
a printed circuit board having two separate transmission stripe segments that have respective ends;
a DC-voltage source having a DC-output terminal; and
an integrated electronic component according to claim 1, wherein the input and output terminals of the integrated electronic component are soldered to both ends of the transmission stripe segments so that the integrated electronic component bridges between the ends of the transmission stripe segments, and the bias terminal of the integrated electronic component is connected electrically to the DC-output terminal of the DC-voltage source, so that both transmission stripe segments together with the integrated electronic component form a continuous signal transmission line.

11. The electrical signal transmission circuit according to claim 10, wherein the printed circuit board further comprises a reference stripe that extends parallel to a first one of the transmission stripe segments, further extends parallel to part of the integrated electronic component between the input and output terminals of the integrated electronic component, and further extends parallel to the other one of the transmission stripe segments.

12. The electrical signal transmission circuit according to claim 11, wherein a local interaction impedance existing between the signal transmission line and the reference stripe exhibits a value at the integrated electronic component that is within 75%-125% of the local interaction impedance at the transmission stripe segments.

13. The electrical signal transmission circuit according to claim 12, wherein a local interaction impedance existing between the signal transmission line and the reference stripe exhibits a value at the integrated electronic component that is within 90%-110% of the local interaction impedance at the transmission stripe segments.

14. A method for manufacturing an integrated electronic component for broadband biasing, the method comprising:
etching at least one trench network having a plurality of trenches into a trench opening surface of substrate having two substrate surfaces that are planar and parallel, with one of the two substrate surfaces being the trench opening surface;
forming a layered capacitor structure having a plurality of layers that extend into the plurality of trenches of the at least one trench network and between at least a portion of the plurality of trenches, the layered capacitor structure having at least two capacitor electrodes and at least one dielectric layer;
forming at least one crater that extends into the substrate from a crater opening surface to a crater bottom level so that a section of the at least one crater decreases from the crater opening surface to the crater bottom level, with the crater opening surface being one of the two substrate surfaces that opposes the trench opening surface;
producing an inductor as a continuous track of an electrically conducting material supported by a slanted peripheral wall of the at least one crater so that the continuous track forms at least one turn parallel to the crater opening surface with turn sections that decrease from the crater opening surface to the crater bottom level, with opposite narrow and large inductor ends of the inductor being situated at the crater bottom level and crater opening surface, respectively; and
connecting electrically the narrow inductor end and one of the at least two capacitor electrodes to an input terminal of the integrated electronic component, the large inductor end to a bias terminal of the integrated electronic component, and the other of the at least two capacitor electrodes to an output terminal of the integrated electronic component.

15. The method according to claim 14, further comprising covering the substrate within the at least one crater with a film of an electrically insulating material so that the slanted peripheral wall of the at least one crater is formed by a concave exposed surface portion of the film.

16. The method according to claim 15, wherein the trench network is etched as a first step and the layered capacitor structure is formed after etching the trench network.

17. The method according to claim 16, further comprising:
forming at least one metallization layer and the input and output terminals above the trench opening surface so that the at least two capacitor electrodes are connected electrically to the input and output terminals, respectively;
reducing a thickness of the substrate by removing substrate material on a side of the substrate opposite the trench opening surface to form the crater opening surface parallel with the trench opening surface, the thickness of the substrate being measured perpendicular to the trench opening surface;
forming the at least one crater by implementing an etching process from the crater opening surface;
covering the substrate within the at least one crater with the film of electrically insulating material;
producing the continuous track of electrically conducting material on the slanted peripheral wall of the at least one crater so that the narrow inductor end is connected to the input terminal through an electrically conducting track contained in the at least one metallization layer; and
forming the bias terminal above the crater opening surface and connecting electrically the bias terminal to the large end of the inductor.

18. The method according to claim 15, further comprising:
etching the at least one crater using a first mask that is formed on the crater opening surface and has an aperture corresponding to the section of the at least one crater at the crater opening surface, and
removing substrate material selectively through the aperture of the first mask by chemically etching.

19. The method according to claim 14, further comprising:
- etching the trench network into a base substrate of the substrate from one surface of the base substrate that forms the trench opening surface;
- forming two through-vias through the base substrate that extend from the trench opening surface to a back surface of the base substrate that is opposite the trench opening surface;
- forming the layered capacitor structure;
- forming at least one metallization layer above the trench opening surface so as to respectively connect electrically the capacitor electrodes to the through-vias;
- forming the input and output terminals on the back surface of the base substrate, so that the input and output terminals are respectively connected electrically to the through-vias;
- forming an upper substrate structure on the base substrate above the trench opening surface and rigidly connected to the trench opening surface, with the upper substrate structure being provided with the at least one crater at a surface of the upper substrate structure that is opposite the base substrate and forms the crater opening surface;
- producing the continuous track of electrically conducting material on the slanted peripheral wall of the at least one crater so that the narrow inductor end is connected to the input terminal through an electrically conducting track contained in the at least one metallization layer; and
- forming the bias terminal above the crater opening surface and connected electrically to the large end of the inductor.

20. The method according to claim 14, wherein the producing of the continuous track of electrically conducting material comprises:
- depositing a seed layer of an electrically conducting material on the slanted peripheral wall of the at least one crater;
- depositing a second mask on the seed layer, with an aperture of the second mask which corresponds to the continuous track;
- depositing the electrically conducting material of the continuous track on the seed layer through the aperture of the second mask, using an electroplating process with electrical current supplied to the seed layer; and
- removing the second mask and a portion of the seed layer that is exposed once the second mask has been removed.

* * * * *